United States Patent
Danno et al.

(10) Patent No.: US 9,508,802 B2
(45) Date of Patent: Nov. 29, 2016

(54) GETTERING PROCESS FOR PRODUCING SEMICONDUCTOR DEVICE

(75) Inventors: Katsunori Danno, Susono (JP); Hiroaki Saitoh, Okazaki (JP); Akinori Seki, Shizuoka-ken (JP); Tsunenobu Kimoto, Kyoto (JP)

(73) Assignees: Toyota Jidosha Kabushiki Kaisha, Toyota-shi, Aichi-ken (JP); Kyoto University, Kyoto-shi, Kyoto (JP)

( * ) Notice: Subject to any disclaimer, the term of this patent is extended or adjusted under 35 U.S.C. 154(b) by 0 days.

(21) Appl. No.: 14/118,095

(22) PCT Filed: May 4, 2012

(86) PCT No.: PCT/IB2012/000875
§ 371 (c)(1),
(2), (4) Date: Nov. 15, 2013

(87) PCT Pub. No.: WO2012/156792
PCT Pub. Date: Nov. 22, 2012

(65) Prior Publication Data
US 2015/0064882 A1    Mar. 5, 2015

(30) Foreign Application Priority Data
May 16, 2011    (JP) .................................. 2011-109766

(51) Int. Cl.
*H01L 21/20*    (2006.01)
*H01L 29/16*    (2006.01)
(Continued)

(52) U.S. Cl.
CPC ...... *H01L 29/1608* (2013.01); *H01L 21/02529* (2013.01); *H01L 21/046* (2013.01);
(Continued)

(58) Field of Classification Search
CPC ... C30B 29/36; C30B 31/22; H01L 21/0445; H01L 21/322; H01L 21/76254; H01L 29/7325; H01L 21/02529; H01L 21/046; H01L 21/263; H01L 21/26506; H01L 21/324; H01L 29/1608; H01L 29/868; H01L 29/872
USPC .......................................................... 438/478
See application file for complete search history.

(56) References Cited

U.S. PATENT DOCUMENTS

| | | | |
|---|---|---|---|
| 2004/0246765 A1* | 12/2004 | Kato | ........................... 365/149 |
| 2007/0020893 A1 | 1/2007 | Ueno et al. | |

(Continued)

FOREIGN PATENT DOCUMENTS

| | | |
|---|---|---|
| EP | 1 883 102 | 1/2008 |
| JP | 58-134430 | 8/1983 |

(Continued)

OTHER PUBLICATIONS

Vodakov, Y. A. et al., "Diffusion and Solubility of Impurities in Silicon Carbide," Silicon Carbide—1973, Proceedings of the Third International Conference on Silicon Carbide held at Miami Beach, Florida, on Sep. 17-20, 1973, pp. 508-519, (1973).

(Continued)

*Primary Examiner* — Duy T Nguyen
(74) *Attorney, Agent, or Firm* — Finnegan, Henderson, Farabow, Garrett & Dunner, LLP (57) ABSTRACT

A process for producing a semiconductor device includes: forming an SiC epitaxial layer on an SiC substrate; implanting the epitaxial layer with ions; forming a gettering layer having a higher defect density than a defect density of the SiC substrate; and carrying out a heat treatment on the epitaxial layer. The semiconductor device includes an SiC substrate, an SiC epitaxial layer formed on the SiC substrate, and a gettering layer having a higher defect density than a defect density of the SiC substrate.

6 Claims, 8 Drawing Sheets (51) Int. Cl.
H01L 21/322 (2006.01)
H01L 29/868 (2006.01)
H01L 29/872 (2006.01)
H01L 21/02 (2006.01)
H01L 21/04 (2006.01)
H01L 21/324 (2006.01)
H01L 21/263 (2006.01)
H01L 21/265 (2006.01)

(52) U.S. Cl.
CPC .......... H01L21/322 (2013.01); H01L 21/324 (2013.01); H01L 29/868 (2013.01); H01L 29/872 (2013.01); *H01L 21/263* (2013.01); *H01L 21/26506* (2013.01)

(56) References Cited

U.S. PATENT DOCUMENTS

| | | |
|---|---|---|
| 2007/0212852 A1 | 9/2007 | Tauzin et al. |
| 2008/0026544 A1 | 1/2008 | Tsuchida et al. |
| 2008/0090383 A1 | 4/2008 | Nakamura et al. |
| 2009/0250705 A1* | 10/2009 | Watanabe et al. ............ 257/77 |
| 2010/0236472 A1 | 9/2010 | Terashima et al. |
| 2011/0233562 A1* | 9/2011 | Harada et al. ................ 257/77 |

FOREIGN PATENT DOCUMENTS

| | | |
|---|---|---|
| JP | 58-147126 | 9/1983 |
| JP | 1-196836 | 8/1989 |
| JP | 3-83343 | 4/1991 |
| JP | 7-201971 | 8/1995 |
| JP | 9-255495 | 9/1997 |
| JP | 2004-335674 | 11/2004 |
| JP | 2006-147680 | 6/2006 |
| JP | 2006-231430 | 9/2006 |
| JP | 2007-36250 | 2/2007 |
| JP | 2007-251172 | 9/2007 |
| JP | 2007-261844 | 10/2007 |
| JP | 2007-281005 | 10/2007 |
| JP | 2008-53667 | 3/2008 |
| JP | 2008-103605 | 5/2008 |
| JP | 2008-109143 | 5/2008 |
| JP | 2009-126770 | 6/2009 |
| JP | 2010-98107 | 4/2010 |
| WO | WO2010119792 | * 10/2010 |

OTHER PUBLICATIONS

Ottaviani, L. et al., "Improvement of the Thermal Conductivity in 4H-SiC Epitaxial Layer by Introducing Gettering Sites," Materials Science forum, vols. 600-603, pp. 525-528, XP-002681559, (2009).

Biondo, S. et al., "Effect of Helium Implantation on Gettering and Electrical Properties of 4H-SiC Epilayers," AIP Conference Proceedings American Institute of Physics USA, vol. 1321, pp. 249-252, XP-002681560, (2010).

Kalinina, E. et al., "Gettering Effect with Al Implanted Into 4H-SiC CVD Epitaxial Layers," Materials Science Forum, vols. 433-436, pp. 637-640, XP-002681561, (2003).

Rao, M. V. et al., "P-N Junction Formation in 6H-SiC by Acceptor Implantation Into N-Type Substrate," Nuclear Instruments and Methods in Physics Research Section B, vol. 106, No. 1, pp. 333-338, XP004001835, (1995).

Caichi, L. et al., "Gettering of Metal Impurities in Silicon by Fast Neutron Irradiation," 1998 5th International Conference on Solid-State and Integrated Circuit Technology, Proceedings (CAT. No. 98EX105), pp. 341-343, XP-002681562, (1998).

* cited by examiner

(1) SCHOTTKY DIODE

(2) SCHOTTKY DIODE

(3) SCHOTTKY DIODE

(4) SCHOTTKY DIODE (5) MESA PIN DIODE (EPITAXIAL JUNCTION)

(6) MESA PIN DIODE (EPITAXIAL JUNCTION)

GETTERING PROCESS FOR PRODUCING SEMICONDUCTOR DEVICE

CROSS-REFERENCE TO RELATED APPLICATIONS

This application is a national phase application of International Application No. PCT/IB2012/000875, filed May 4, 2012, and claims the priority of Japanese Application No. 2011-109766, filed May 16, 2011, the content of both of which is incorporated herein by reference.

BACKGROUND OF THE INVENTION

1. Field of the Invention

The invention relates to a process for producing a semiconductor device and the semiconductor device, and more specifically, relates to the gettering of impurities in an SiC substrate for forming a semiconductor device.

2. Description of Related Art

To prevent degradation of semiconductor characteristics by metallic impurities in a semiconductor crystal of Si, etc., a strain region is created by ion implantation, laser irradiation, forming a film of a different material, and the like, to provide a gettering center for the impurities.

As a problem unique to SiC monocrystals, the inventors have discovered that when a heat treatment is carried out thereon at a high temperature, particularly a temperature of 1500° C. or higher, impurities such as metals that are either contained in the crystal or lie adjacent thereto diffuse through the crystal.

Impurities are always present in SiC semiconductor monocrystals that are used as practical materials. More specifically, when SiC monocrystals are grown by the solution method, metal elements are often added to the SiC solution to increase the growth rate, improve crystallinity, and the like. For example, Japanese Patent Application Publication No. 2007-261844 (JP-2007-261844 A) discloses the addition of Cr, and Japanese Patent Application Publication No. 2009-426770 (JP-2009-126770 A) discloses the addition of Ni to the SiC growth solution, and in some cases these metals remain as impurities in the grown SiC monocrystal. When an epitaxial layer for the device region is formed on such an SiC substrate produced by the solution method, the diffusion of the metal impurities from the SiC substrate into the epitaxial layer will degrade the properties of the device.

Therefore, the amounts of impurity elements adversely affecting conductive and device properties that are incorporated into the crystal must be reduced and those impurity elements that do become incorporated must be contained outside the device region. In the case of a Si crystal, alkali metal elements such as Na, K, Li, etc., and heavy metal elements such as Fe, Cu, Au, Cr, etc., are taken into account. It is known that alkali metal elements affect adversely metal-oxide-semiconductor (MOS) characteristics, and heavy metal elements cause shortening carrier life and oxidation stacking fault (OSF) defects. Therefore, the gettering (capture and immobilization) of these residual impurity elements by the use of a strained layer that is intentionally formed in a specific part of the crystal (outside the device region) is already available in the case of Si crystals.

In the case of an SiC crystal, on the other hand, thermal diffusion is not considered to occur substantially at the kind of heat treatment temperature (maximum of about 1200° C.) than is normally used for a Si crystal because the diffusion coefficient of the impurities is extremely small (Yu. A. Vodakov and E. N. Mokhov, "Silicon Carbide" 1973 (Univ. South Carolina Press, Columbia, 1974, p. 508)). Therefore, almost no reports concerning gettering technology in SiC crystals can be found.

With this new knowledge, however, the inventors have ascertained that when a high temperature heat treatment (1500° C. or higher) specific to SiC is carried out, even heavy metal elements such as Cr and Ni will diffuse through the SiC crystal even though the diffusion coefficients of the impurities are low compared with Si. Therefore, these elements must be taken into account, and it has become necessary carry out a gettering treatment on SiC crystals.

Japanese Patent Application Publication No. 2007-251172 (JP-20077-251172 A) discloses using He and H ion beams to form an ion-enriched layer of a given depth on an SiC substrate or a Si substrate, and then conducting gettering to trap contaminants such as heavy metal ions by carrying out a heat treatment at a temperature that does not exceed a critical temperature whereat destruction of the substrate occurs. Unlike Si, however, in SiC, the diffusion of contaminants does not easily occur and it is difficult to achieve recovery of the substrate after gettering. Therefore, as an issue specific to SiC, it is necessary to focus on the sites on the substrate and the manufacturing processes that require gettering, and to eliminate, unnecessary process steps. However, JP-2007-251172 A does not disclose an example wherein gettering is carried out on SiC, and it contains no statements or implications relevant to this issue.

Japanese Patent Application Publication No. 2010-098107 (JP-2010-098107 A) discloses that in a semiconductor apparatus used as an imaging device, a gettering layer of a desired depth was fabricated by irradiation with a laser beam from the side opposite the epitaxial layer, which is the structural element for forming the circuit layer, etc.

Japanese Patent Application Publication No. 2006-231430 (JP-2006-231430 A) discloses setting the temperature for forming a gettering layer at 1100° C. to 1300° C. when carrying out gettering of heavy metals.

Japanese Patent Application Publication No. 58-147126 (JP-58-147126 A) discloses forming a gettering layer on the underside of a semiconductor substrate by carrying out a heat treatment at a temperature of 1050° C. or higher to diffuse supersaturated interstitial oxygen therethrough.

Japanese Patent Application Publication No. 07-201971 (JP-07-201971 A) discloses fabricating a plurality of semiconductor device sections on a substrate and forming a gettering site on the sides opposite the divided sections of the semiconductor devices that also serve as the device, formation regions of the semiconductor substrate.

However, none of this related art assumes the diffusion of contaminating metallic elements that are either present in the substrate crystal or infiltrate from outside the substrate crystal in a SiC semiconductor substrate, and they have not noticed the need of a gettering layer therefor, particularly when a heat treatment at 1500° C. or higher is carried out.

SUMMARY OF THE INVENTION

The invention provides a process for producing a semiconductor device that includes forming a gettering layer to capture and immobilize impurity elements in an SiC semiconductor substrate. The invention also provides a semiconductor device that includes a gettering layer to capture and immobilize impurity elements in an SiC semiconductor substrate.

A first aspect of the invention relates to a process for producing a semiconductor device. This production process includes: forming an SiC epitaxial layer on an SiC substrate; implanting the epitaxial layer with ions; forming a gettering layer having a higher defect density than a defect density of the SiC substrate; and carrying out heat treatment on the epitaxial layer.

According to the first aspect of the invention, because a gettering layer with a higher defect density than the SiC substrate is formed, the impurity elements are captured and immobilized preferentially in the gettering layer.

In this production process, the heat treatment may include a treatment at 1500° C. or higher, and the gettering layer may be formed prior to the treatment at 1500° C. or higher.

In this production process, the gettering layer may be formed by ion implantation to the epitaxial layer, and an amount of an implantation dose may be controlled such that the defect density of the gettering layer is higher than the density of impurities to be captured, and a compensated defect density is equal to or lower than a carrier density of the semiconductor device.

In this production process, the gettering layer may be formed deeper than a depth of material removed by etching that is carried out prior to growing the epitaxial layer.

In this production process, the gettering layer may be formed in a region, on the SiC substrate, other than a device formation region where the semiconductor device is to be formed on the SiC substrate.

In this production process, the defect density of the gettering layer may be determined on the basis of electrical current on the SiC substrate when the semiconductor device is operated.

In this production process, the gettering layer may be formed in a region, on the SiC substrate, other than a device formation region when the gettering layer is formed in the epitaxial layer after the epitaxial layer has grown.

In this production process, the gettering layer may be formed by irradiation with an electron beam or neutron beam from aside opposite to an epitaxial layer side of the SiC substrate.

A second aspect of the invention relates to a semiconductor device. This semiconductor device includes an SiC substrate, an SiC epitaxial layer formed on the SiC substrate, and a gettering layer having a higher defect density than a defect density of the SiC substrate.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

The production process of the semiconductor device of the invention includes the steps of forming an SiC epitaxial layer on an SiC substrate, and when a semiconductor device is fabricated by conducting various types of ion implantation and heat treatments on the epitaxial layer, forming a gettering layer with a higher defect density than the SiC substrate.

More specifically, before a high-temperature heat treatment of 1500° C. or higher (including oxidation and crystal growth) is carried out, by ion implantation of an element, such as a noble gas in a SiC monocrystal substrate at high density, impurity elements such as heavy metals that will be incorporated into the crystal during the high-temperature heat treatment are captured and immobilized in the gettering layer, thereby blocking the diffusion thereof.

In one aspect of the invention, a gettering layer is formed on the SiC substrate to prevent the impurities contained in the SiC substrate from diffusing to the epitaxial layer that contains the device formation region that has been formed on the substrate. This primarily counteracts diffusion in the direction of substrate thickness.

More specifically, when a low N (nitrogen) density epitaxial growth layer, i.e., a device formation region, is stacked on top of the substrate, ions of a rare gas element are implanted into the surface of the substrate before epitaxial growth, and a gettering layer is formed wherein the implanted ion density assumes a Gaussian distribution, a box profile distribution (constant within a given range of depth), etc.

Before epitaxial growth is carried out, part of the surface of the substrate is removed by $H_2$ etching to expose a clean fresh surface. Therefore, ion implantation to form the gettering layer, which is carried out before the above step ($H_2$ etching), must be continued until it is deeper than the amount of material to be removed by the $H_2$ etching.

In addition, the implantation dose must be controlled such that the density of defects forming the gettering layer that is generated by the ion implantation will be greater than the density of the impurities to be captured, and such that the compensation defect density (gettering sites+non-gettering sites) does not exceed the concentration of the semiconductor device carrier (e.g., the N density (in the case of an n-type semiconductor)). By so doing, it becomes easier to guarantee conductivity in the SiC substrate because the movement of electrons is assured even after the introduction of the defects for gettering. The defect density of the gettering layer is determined on the basis of the electrical current on the SiC substrate when the semiconductor device is operated.

Figure 1:
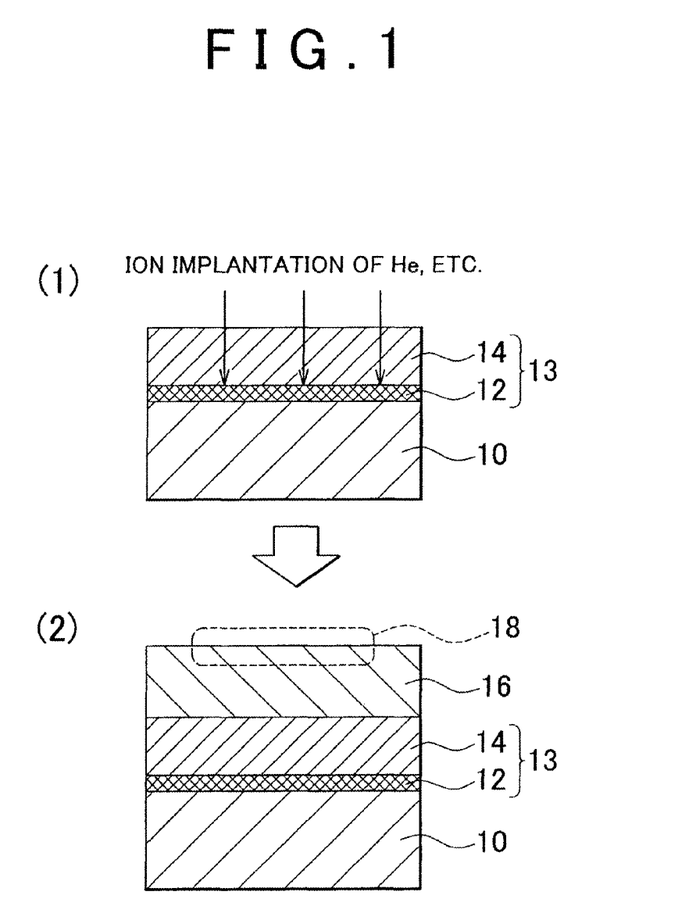
FIG. 1 shows the formation of the gettering layer according to one aspect of the invention.

As shown at the top of FIG. 1, point defects, dislocations, stacking faults, etc., are formed at the ion implantation region 12 or the region that the implanted ions have passed through 14 on the substrate 10 by a rare gas such as He. These defects act as gettering sites and as a whole form a gettering layer 13. As shown at the bottom of FIG. 1, when low N concentration epitaxial layer 16 is formed at 1500° C. to 1800° C., for example, impurities such as heavy metals that diffuse from the substrate 10 are captured and immobilized in the gettering layer 13. As a result, diffusion and infiltration of impurity elements from the substrate 10 into the epitaxial layer 16 is prevented.

Preferably a rare gas such as He or Ar is used as the implantation ion. H, or group 4 elements such as Si, C, or Ge can also be used. In the case of an n-type semiconductor substrate, a group 5 element such as N can also be used. Group 3 elements are undesirable because they have the effect of reducing conductivity.

As a method of forming the gettering layer 13 other than ion implantation, any method that can form defects from the outermost surface of the substrate such as electron beam irradiation, neutron beam irradiation, etc., can also be used.

The gettering layer formed by the method of the invention can capture and immobilize (getter) a variety of heavy metal elements. This layer is particularly effective for gettering Cr, Ni, Fe, Zn, etc.

Figure 2:
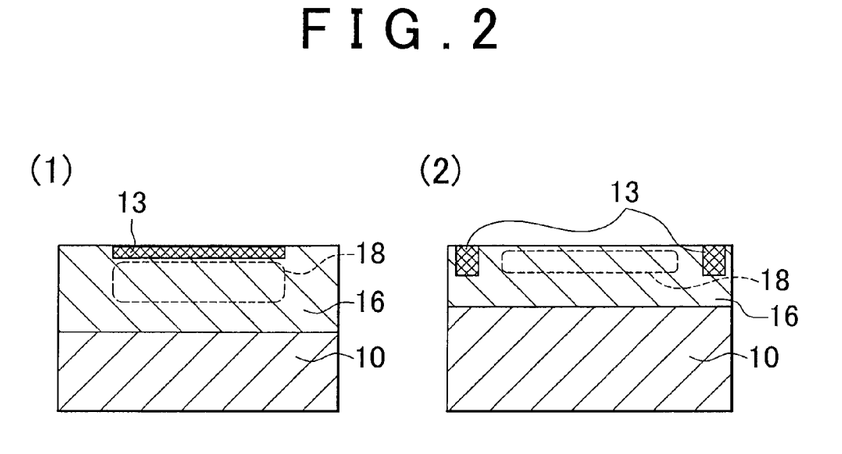
FIG. 2A shows the formation of the gettering layer according to another aspect of the invention.
FIG. 2B shows the formation of the gettering layer according to another aspect of the invention.

In another aspect of the invention, a gettering layer is formed at a site other than a region whereon a semiconductor device will be formed (also referred to herein as the "device formation region") in the epitaxial layer on the SiC substrate (i.e., other than the breakdown voltage holding member) and, rather than the impurities within the SiC substrate, impurities infiltrating from areas surrounding the substrate are prevented from diffusing into the epitaxial layer that contains the device formation region. In one case, as shown in FIG. 2A, a gettering layer 13 is formed at a position shallower than the device formation region 18 of the epitaxial layer 16 to counteract diffusion in the direction of substrate thickness, and in another case, as shown in FIG. 2B, a gettering layer 13 is formed at a site that surrounds the device formation region 18 of the epitaxial layer 16 horizontally to counteract diffusion in the parallel direction to the surface of the substrate. As described below, metals such as Cr diffuse through the epitaxial layer very easily, so if gettering is impossible within a device region such as a p-n junction device resulting from an epitaxial junction, a gettering layer can be formed within the contact layer or at another member (e.g., a device isolation layer, etc.) near the surface as shown in FIGS. 2A and 2B.

Typically, the impurities diffuse when a heat treatment is carried out at a high temperature exceeding 1500° C. At this time, there is concern that the device properties will change if gettering should occur within the device formation region, so gettering is carried out at a site outside the device formation region. In particular, it is necessary to make sure that the implanted ions, electrons, etc., do not pass through any region to which the depletion layer extends when the device is operated. Regardless of whether the site formed gettering layer is a region where current flows or does not flow, the amount of the dose is controlled such that it does not dramatically inhibit current flow.

Unlike Si, SiC is a compound semiconductor, and therefore the crystal defects that are produced when the implanted ions, electrons, etc., pass through the crystal (particularly, intrinsic defects such as atomic vacancies) are thermally stable, and in some cases recovery is impossible even if a heat treatment is carried out at a temperature exceeding 1700° C. In the case of Si, the number of divacancies decreases with a heat treatment at about 400° C. Therefore, if implantation species pass through the device formation region of SiC, the device may not operate as designed.

Figure 3:
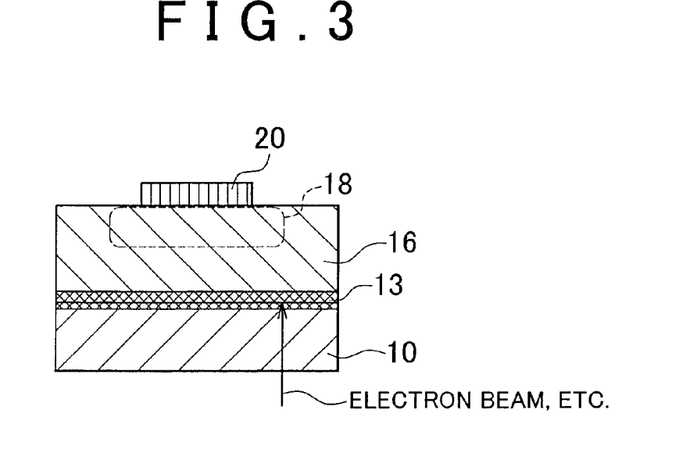
FIG. 3 shows the formation of the gettering layer according to yet another aspect of the invention.
Figure 4:
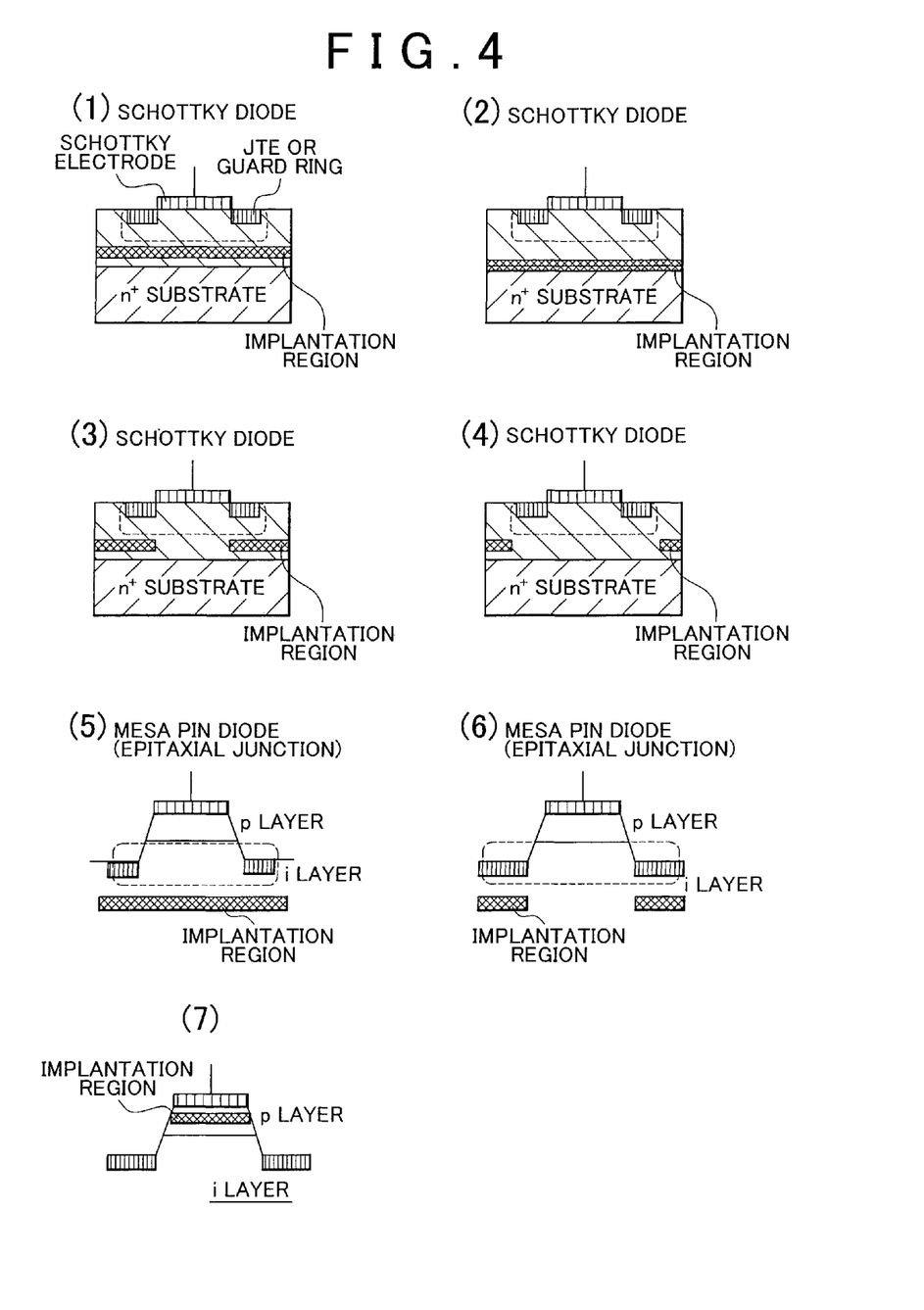
FIG. 4A shows an example wherein the formation of the gettering layer of the invention has been applied.
FIG. 4B shows an example wherein the formation of the gettering layer of the invention has been applied.
FIG. 4C shows an example wherein the formation of the gettering layer of the invention has been applied.
FIG. 4D shows an example wherein the formation of the gettering layer of the invention has been applied.
FIG. 4E shows an example wherein the formation of the gettering layer of the invention has been applied.
FIG. 4F shows an example wherein the formation of the gettering layer of the invention has been applied.
FIG. 4G shows an example Wherein the formation of the gettering layer of the invention has been applied.

In still another aspect of the invention, a gettering layer 13 can be formed without introducing defects into the device formation region by carrying out irradiation or implantation of the epitaxial layer 16 with an electron beam, neutron beam, or lightweight ions from the back side rather than from the upper side of the substrate 10 as shown in FIG. 3. FIG. 3 illustrates a case wherein an electrode 20 is formed on the device formation region 18.

FIGS. 4A to 4G illustrate examples wherein the method of the invention has been applied to various types of semiconductor devices. The invention can also be applied to various types of devices such as transistors other than those illustrated in the drawings.

The invention is described in greater detail below through examples.

Comparative Example 1

Figure 5:
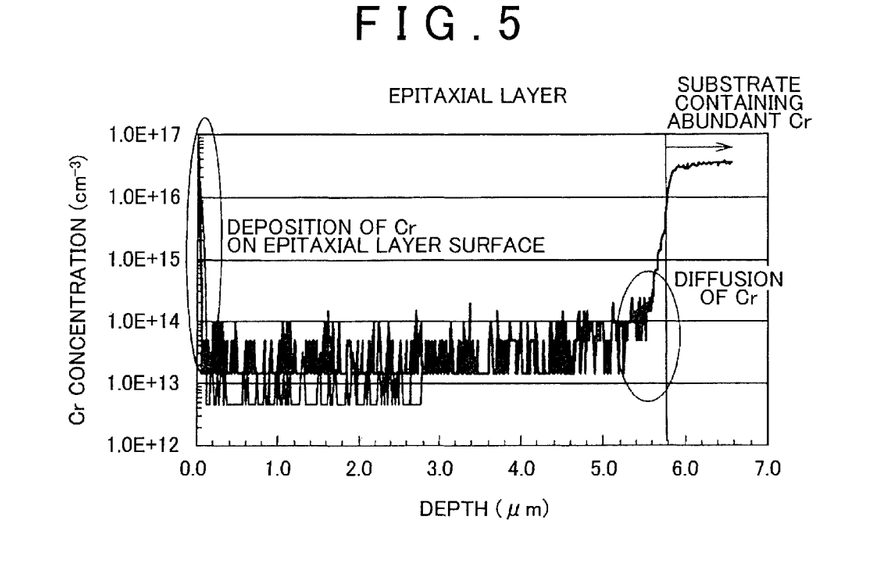
FIG. 5 shows a profile of the Cr concentration in Comparative Example 1.

An SiC substrate with a particularly high Cr concentration ($10^{17}$ cm$^{-3}$) was fabricated by the solution method to verify the effect of the invention. An epitaxial layer was formed on this substrate by chemical vapor deposition (CVD). As shown in FIG. 5, the profile of Cr concentration in the resulting material revealed that Cr had diffused from the substrate into the epitaxial layer, and part of the Cr had even penetrated to the surface of the test sample.

Comparative Example 2

Figure 6:
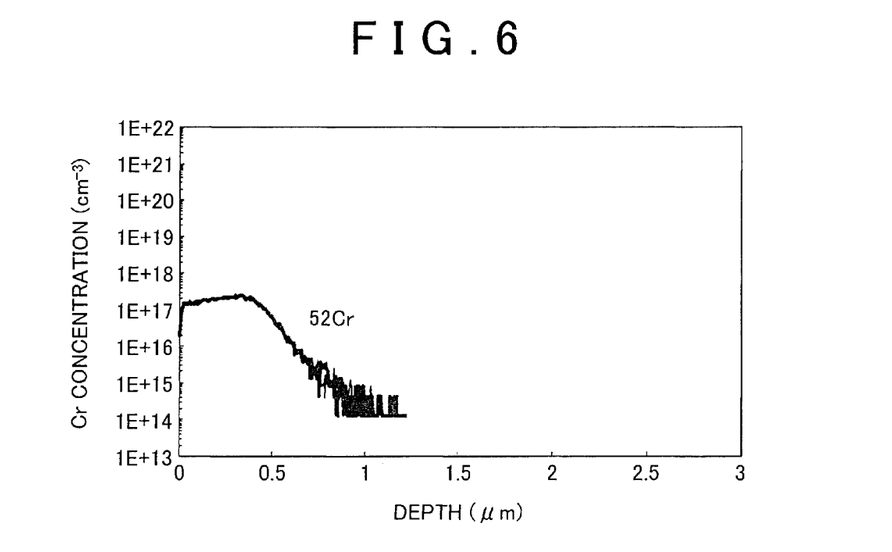
FIG. 6 shows a profile, of the Cr concentration in Comparative Example 2.
Figure 7:
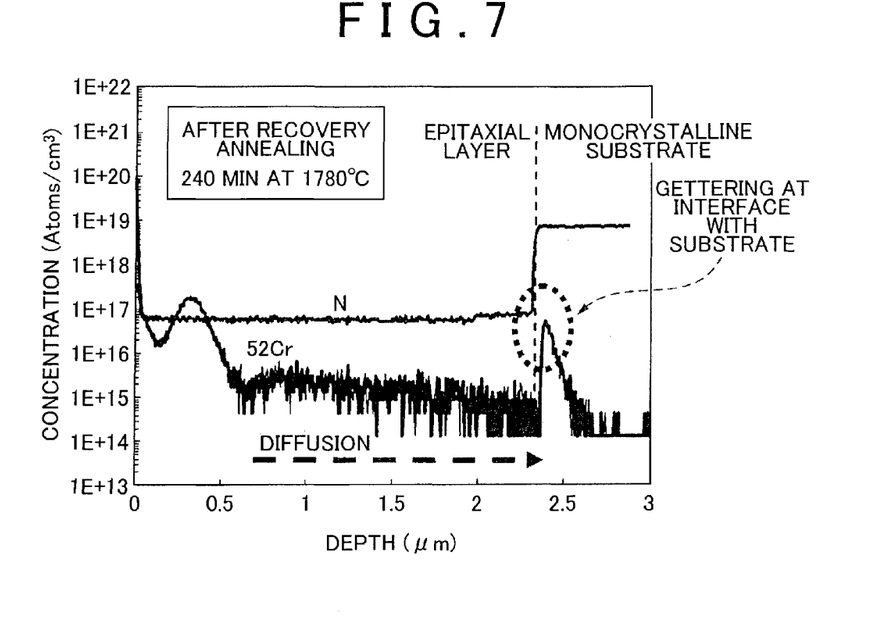
FIG. 7 shows a profile of the Cr concentration in Comparative Example 3.

To observe the phenomenon of Comparative Example 1 more easily, Cr was implanted into the surface of the epitaxial layer by ion implantation. As illustrated in FIG. 6, a box profile distribution with a depth of 400 nm and a concentration of $1 \times 10^{17}$ cm$^{-3}$ was formed. When this test sample was heat treated for 240 min at 1780° C., the profile of the Cr concentration changed as shown in FIG. 7. This difference means that the implanted Cr had diffused.

Table 1 shows a summary of the relationship between heat treatment temperature and the presence or absence of diffusion. It is clear that Cr diffuses with a heat treatment of 1500° C. or higher.

TABLE 1

| Heat treatment temperature | Diffusion (Yes/No) |
| --- | --- |
| 1300° C. | Almost none |
| 1500° C. | Yes |
| 1780° C. | Yes |
| 1850° C. | Yes |

Comparative Example 3

The same test as in Comparative Example 2 was carried out using a commercially available SiC wafer, and the results revealed no Cr diffusion. Therefore, it is clear that gettering of Cr is caused by defects that are few in an epitaxial layer and that are many in a commercially available wafer.

Example 1

Figure 8:
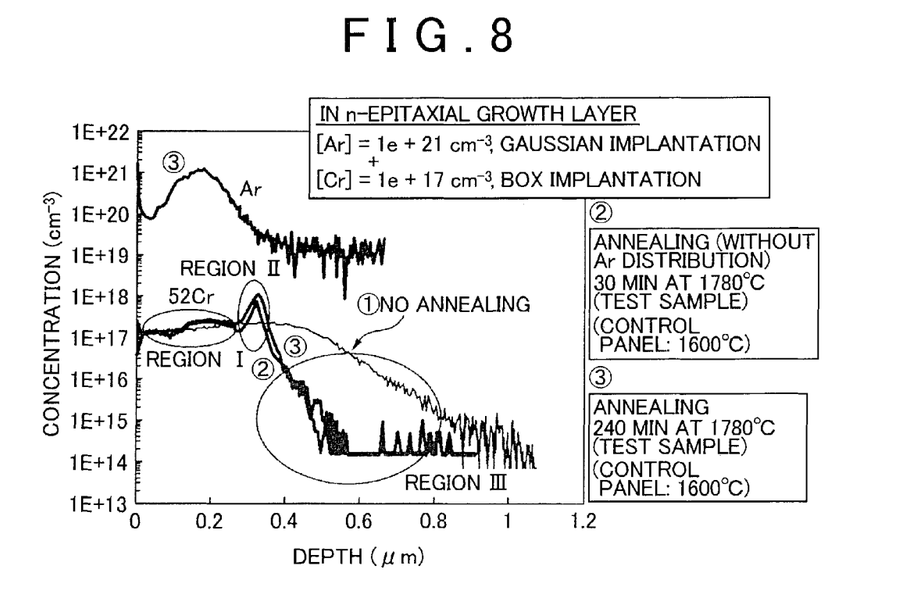
FIG. 8 shows a profile of the Cr concentration in Example 1 of the invention.

Additional defects were introduced by also implanting Ar ions into a test sample that had undergone Cr ion implantation on the surface of the epitaxial layer in the same manner as in Comparative Example 2. The Ar was introduced in a Gaussian distribution to a depth of 200 nm at a concentration of $1\times10^{21}$ cm$^{-3}$ (monoenergetic implantation at an energy of 270 keV). This test sample was heat treated for 30 min at 1780° C. As shown in FIG. 8, the results reveal that the Cr concentration profile was almost unchanged in the ion implantation region (Ar penetration region), i.e., gettering had occurred.

Example 2

Figure 9:
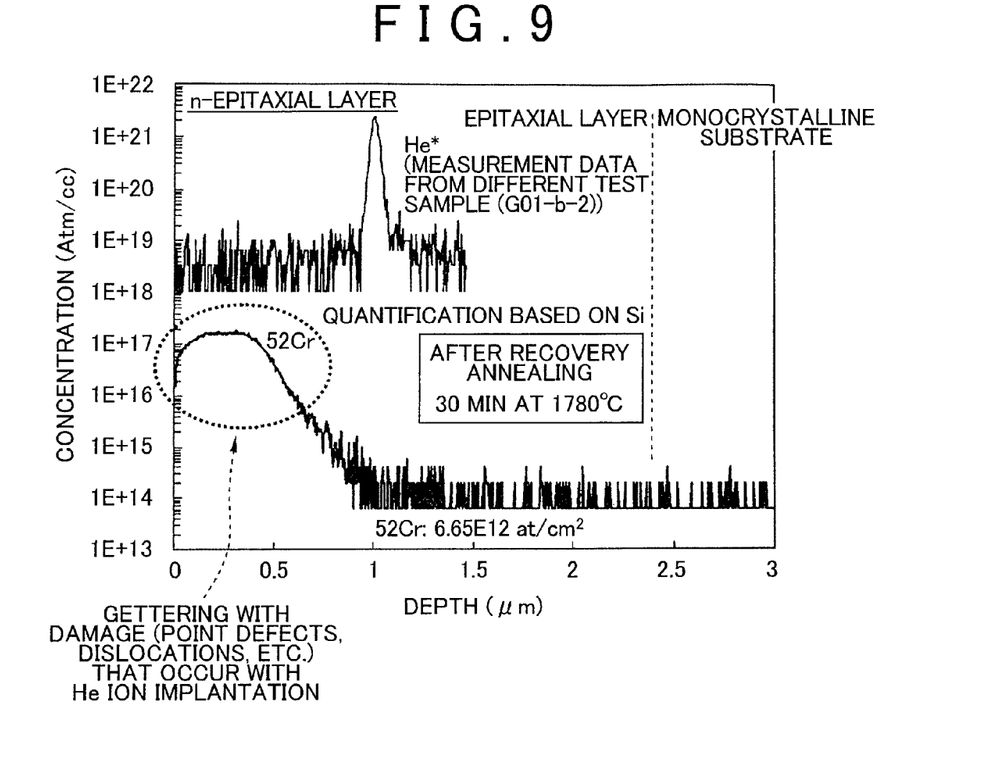
FIG. 9 shows a profile of the Cr concentration in Example 2 of the invention.

Additional defects were introduced by also implanting He ions into a test sample that had undergone Cr ion implantation on the surface of the epitaxial layer in the same manner as in Comparative Example 2. The He was introduced in a Gaussian distribution to a depth of 1 μm at a concentration of $1\times10^{21}$ cm$^{-3}$ (monoenergetic implantation at an energy of 360 keV). This test sample was heat treated for 30 min at 1780° C. As shown in FIG. 9, the results revealed that the Cr concentration profile was almost unchanged in the ion implantation region (He penetration region), i.e., gettering had occurred.

Example 3

Figure 10:
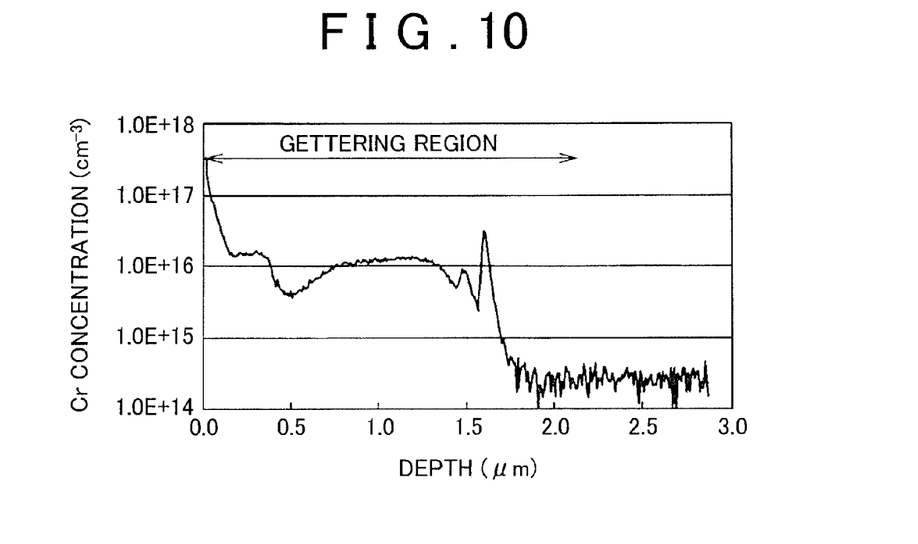
FIG. 10 shows a profile of the Cr concentration in Example 3 of the invention.

Additional defects were introduced by also implanting He ions into a test sample that had undergone Cr ion implantation on the surface of the epitaxial layer in the same manner as in Comparative Example 2. The H was introduced in a Gaussian distribution to a depth of 2.2 μm at a concentration of $1\times10^{20}$ cm$^{-3}$ (monoenergetic implantation at an energy of 350 keV). This test sample was heat treated for 30 min at 1780° C. As shown in FIG. 10, the results reveal that although the Cr concentration profile changed in the ion implantation region (H penetration region), Cr remained at a concentration of about $1\times10^{16}$ cm$^{-3}$ in the H implantation region, and it appears that gettering occurred. In this example it appears that Cr, which had not been completely captured, diffused because the H implantation dose was insufficient. It is clear, however, that gettering is possible even with H. Theoretically, a similar gettering effect as with H implantation can be expected with an electron beam or neutron beam (but the implantation dose must be made sufficiently large).

Example 4

Figure 11:
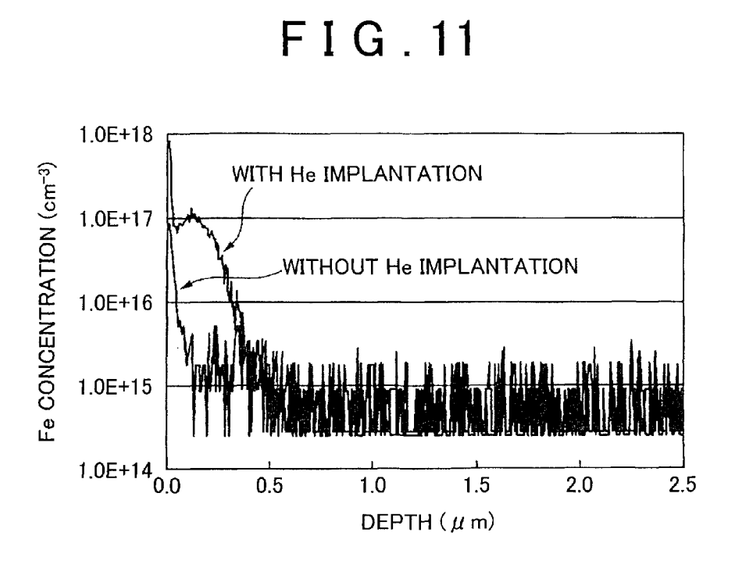
FIG. 11 shows a profile of the Fe concentration in Example 4 of the invention.

Fe ions were implanted into the epitaxial layer, and a box profile distribution with a depth of 400 nm and a concentration of $1\times10^{17}$ cm$^{-3}$ was formed. Then He ions were implanted into this test sample in the same manner as in Example 2, and after a heat treatment for 30 min at 1780° C., the Fe concentration profile was investigated. As shown in FIG. 11 ("with He implantation"), the results clearly reveal that a box profile was retained and that gettering occurred (diffusion was blocked).

Comparative Example 4

Fe ions were implanted in the same manner as in Example 4, but He ions were not implanted. In this case, as shown in FIG. 11 ("without He implantation"), the box profile becomes disarrayed, and the Fe clearly has diffused (gettering did not occur).

Example 5

Figure 12:
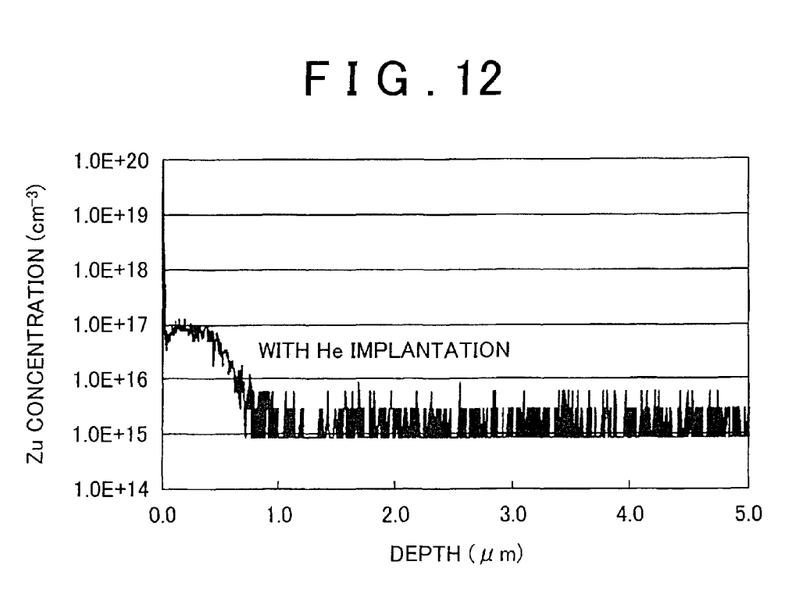
FIG. 12 shows a profile of the Zn concentration in Example 5 of the invention.

Zn ions were implanted into the epitaxial layer, and a box profile distribution with a depth of 400 nm and a concentration of $1\times10^{17}$ cm$^{-3}$ was formed. Then He ions were implanted into this test sample in the same manner as in Example 2, and after a heat treatment for 30 min at 1780° C., the Zn concentration profile was investigated. As shown in FIG. 12, the results clearly reveal that a box profile was retained and that gettering occurred (diffusion was blocked).

Example 6

Figure 13:
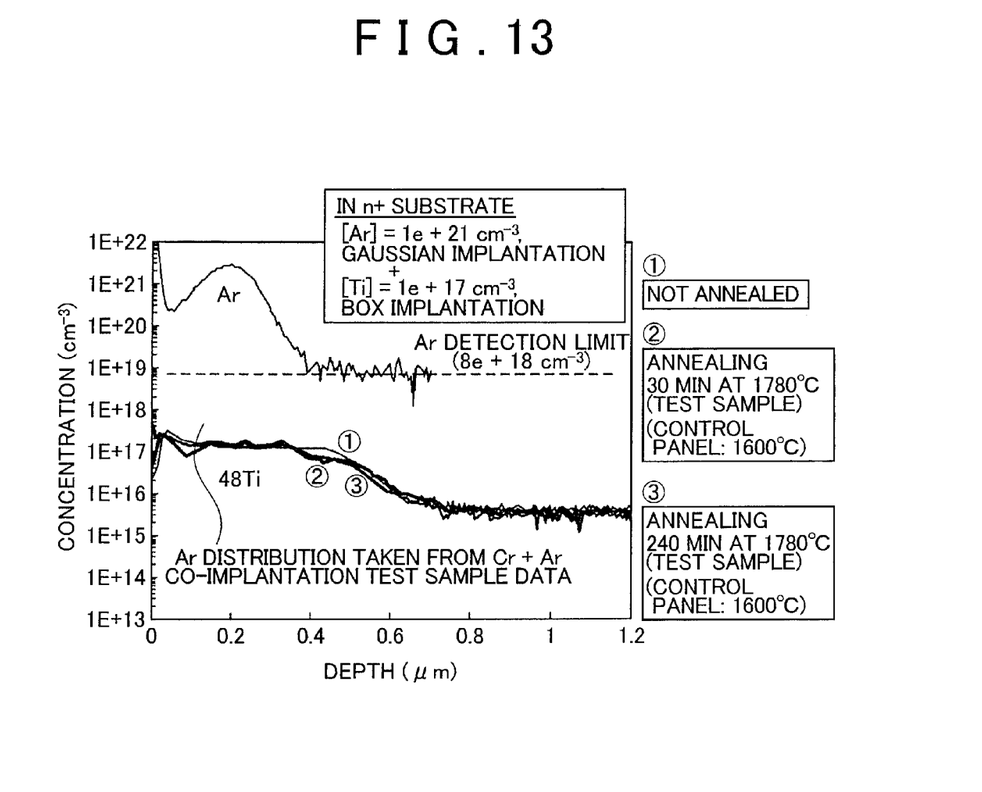
FIG. 13 shows a profile of the Ti concentration in Example 6 of the invention.

Ti ions were implanted into the epitaxial layer, and a box profile distribution with a depth of 400 nm and a concentration of $1\times10^{17}$ cm$^{-3}$ was formed. Then Ar ions were implanted into this test sample in the same manner as in Example 1, and after a heat treatment for 30 min at 1780° C., the Ti concentration profile was investigated. As shown in FIG. 13, the results clearly reveal that a box profile was retained and that gettering occurred (diffusion was blocked).

According to the invention, a process for producing a semiconductor device is provided that includes the formation of a gettering layer to capture and immobilize impurity elements in an SiC semiconductor substrate.

The invention claimed is:

1. A process for producing a semiconductor device, the process comprising:
    forming an SiC epitaxial layer on an SiC substrate, wherein the epitaxial layer is heat treated in the process, the epitaxial layer containing heavy metal impurities;
    forming, after forming the SiC epitaxial layer on the SiC substrate, a gettering layer by implanting ions different from the heavy metal impurities into at least one of the SiC substrate or the epitaxial layer, the gettering layer having a higher defect density than a defect density of the SiC substrate; and
    conducting gettering of the heavy metal impurities at 1500° C. or higher after the gettering layer is formed.

2. The process according to claim 1, wherein, in the gettering layer, a density of the implanted ions is $1\times10^{17}$ cm$^{-3}$ to $1\times10^{21}$ cm$^{-3}$.

3. The process according to claim 1, wherein the gettering layer is formed deeper than a depth of material removed by etching that is carried out before the epitaxial layer is formed.

4. The process according to claim 1, wherein the gettering layer is formed in a region, on the SiC substrate, other than a device formation region where the semiconductor device is to be formed on the SiC substrate.

5. The process according to claim 1, wherein the gettering layer is formed in a region within the epitaxial layer after the epitaxial layer has been formed, the region being other than a device formation region where the semiconductor device has been formed on the SiC substrate.

6. The process according to claim 1, wherein forming the gettering layer includes implanting the ions from a side opposite to an epitaxial layer side of the SiC substrate.

* * * * *